(12) United States Patent
Morin et al.

(10) Patent No.: US 10,505,043 B2
(45) Date of Patent: *Dec. 10, 2019

(54) SEMICONDUCTOR DEVICE WITH FIN AND RELATED METHODS

(71) Applicant: STMICROELECTRONICS, INC., Coppell, TX (US)

(72) Inventors: Pierre Morin, Kessel-Lo (BE); Nicolas Loubet, Guilderland, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/212,632

(22) Filed: Dec. 6, 2018

(65) Prior Publication Data

US 2019/0189802 A1  Jun. 20, 2019

Related U.S. Application Data

(63) Continuation of application No. 15/723,152, filed on Oct. 2, 2017, now Pat. No. 10,177,255, which is a continuation of application No. 15/255,862, filed on Sep. 2, 2016, now Pat. No. 9,806,196, which is a continuation of application No. 14/663,843, filed on Mar. 20, 2015, now Pat. No. 9,466,718.

(60) Provisional application No. 61/972,527, filed on Mar. 31, 2014.

(51) Int. Cl.
  *H01L 21/00* (2006.01)
  *H01L 29/78* (2006.01)
  *H01L 29/66* (2006.01)
  *H01L 29/165* (2006.01)
  *H01L 27/088* (2006.01)

(52) U.S. Cl.
  CPC ...... *H01L 29/7848* (2013.01); *H01L 27/0886* (2013.01); *H01L 29/165* (2013.01); *H01L 29/66795* (2013.01); *H01L 29/785* (2013.01)

(58) Field of Classification Search
  None
  See application file for complete search history.

(56) References Cited

U.S. PATENT DOCUMENTS 7,385,247 B2   6/2008  Rhee et al.
8,310,013 B2  11/2012  Lin
8,334,185 B2  12/2012  Kronholz et al.
(Continued)

OTHER PUBLICATIONS

Agopian et al., "Uniaxial and/or Biaxial Strain Influence on MuGFET Devices," *Journal of the Electromechanical Society* 159(6):H570-H574, 2012.
(Continued)

*Primary Examiner* — Reema Patel
(74) *Attorney, Agent, or Firm* — Seed IP Law Group LLP

(57) ABSTRACT

A semiconductor device may include a substrate, a fin above the substrate and having a channel region therein, and source and drain regions adjacent the channel region to generate shear and normal strain on the channel region. A semiconductor device may include a substrate, a fin above the substrate and having a channel region therein, source and drain regions adjacent the channel region, and a gate over the channel region. The fin may be canted with respect to the source and drain regions to generate shear and normal strain on the channel region.

15 Claims, 11 Drawing Sheets

(56) References Cited

U.S. PATENT DOCUMENTS

| | | | |
|---|---|---|---|
| 8,450,194 B2 | 5/2013 | Waite et al. | |
| 8,629,477 B2 | 1/2014 | Lochtefeld et al. | |
| 9,466,718 B2* | 10/2016 | Morin | H01L 29/7848 |
| 9,806,196 B2* | 10/2017 | Morin | H01L 29/7848 |
| 10,177,255 B2* | 1/2019 | Morin | H01L 29/7848 |
| 2006/0154426 A1 | 7/2006 | Anderson et al. | |
| 2010/0025743 A1 | 2/2010 | Hoentschel et al. | |
| 2010/0133614 A1 | 6/2010 | Beyer et al. | |
| 2011/0248322 A1 | 10/2011 | Wong et al. | |
| 2012/0153402 A1 | 6/2012 | Kronholz et al. | |
| 2012/0161238 A1 | 6/2012 | Scheiper et al. | |
| 2012/0211838 A1 | 8/2012 | Kronholz et al. | |
| 2012/0248595 A1 | 10/2012 | Or-Bach et al. | |
| 2012/0267683 A1 | 10/2012 | Kronholz et al. | |
| 2013/0001698 A1 | 1/2013 | Waite et al. | |
| 2013/0095627 A1 | 4/2013 | Flachowsky et al. | |
| 2013/0175585 A1 | 7/2013 | Tan et al. | |
| 2013/0241026 A1 | 9/2013 | Or-Bach et al. | |
| 2013/0248985 A1 | 9/2013 | Amarnath et al. | |
| 2013/0267046 A1 | 10/2013 | Or-Bach et al. | |
| 2013/0285116 A1 | 10/2013 | Lochtefeld et al. | |
| 2013/0285138 A1 | 10/2013 | Vega et al. | |
| 2013/0320449 A1 | 12/2013 | Hoentschel et al. | |
| 2013/0320450 A1 | 12/2013 | Hoentschel et al. | |
| 2014/0203370 A1 | 7/2014 | Maeda et al. | |
| 2015/0001593 A1* | 1/2015 | Kuo | H01L 29/785 257/288 |

OTHER PUBLICATIONS

Dos Santos et al., "Impact of Selective Epitaxial Growth and Uniaxial /Biaxial Strain on DIBL Effect Using Triple Gate FinFETs," *Journal Integrated Circuits and Systems* 5(2):154-159, 2010.

Xu, "Effectiveness of Strain Solutions for Next-Generation MOSFETs," Dissertation, Engineering-Electrical Engineering and Computer Sciences in the Graduate Division of the University of California, Berkeley, 2012, 103 pages.

\* cited by examiner

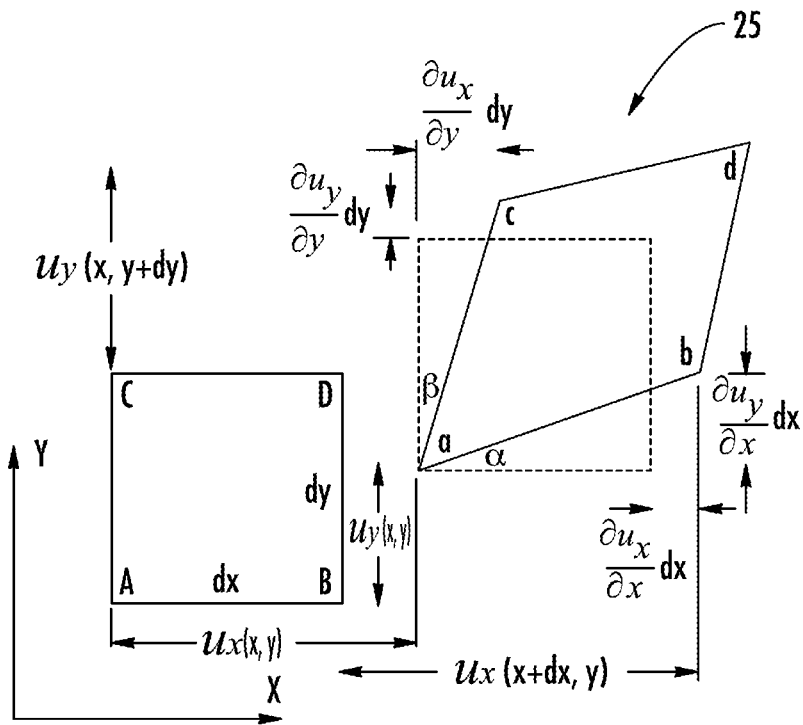
FIG. 2
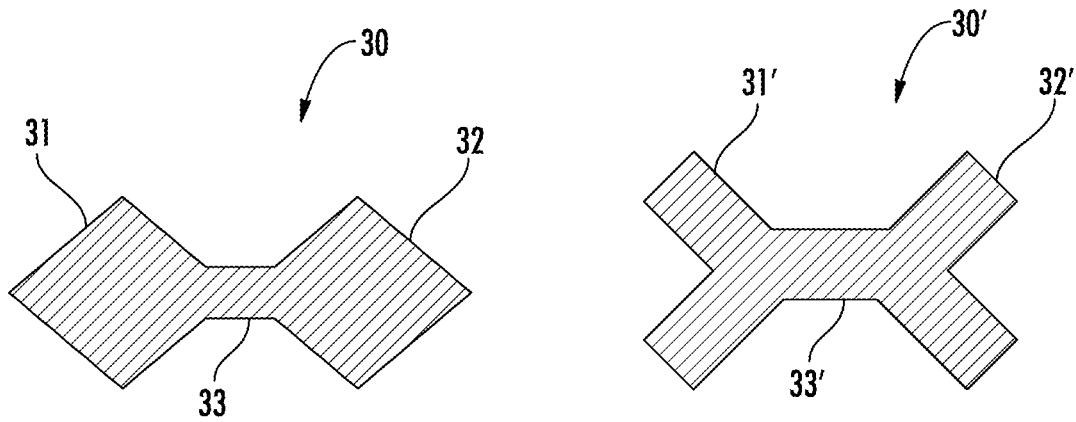
FIG. 3A
FIG. 3B

SEMICONDUCTOR DEVICE WITH FIN AND RELATED METHODS

TECHNICAL FIELD

The present disclosure relates to the field of electronic devices and, more particularly, to semiconductor devices and related methods.

BACKGROUND

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

One example FINFET device is disclosed in U.S. Pat. No. 8,310,013 to Lin et al. The FINFET device includes a substrate of a crystalline semiconductor material having a top surface of a first crystal plane orientation, a fin structure of the crystalline semiconductor material overlying the substrate, a gate structure over a portion of the fin structure, and an epitaxial layer over another portion of the fin structure. The epitaxial layer has a surface with a second crystal plane orientation. The epitaxial layer and underlying fin structure include a source and drain region. The source region is separated from the drain region by the gate structure. A channel is defined in the fin structure from the source region to the drain region, and aligned in a direction parallel to both the surface of the epitaxial layer and the top surface of the substrate. Despite the existence of such configurations, further enhancements in FINFET devices may be desirable in some applications, particularly next generation devices with relatively small dimensions.

FIG. 1 shows an approach to a FINFET device 20. The FINFET device 20 illustratively includes a silicon substrate 22, and a silicon channel 23 over the substrate, and a silicon germanium stressor layer 21 over the channel.

SUMMARY

Generally speaking, a semiconductor device may include a substrate, at least one fin above the substrate and having a channel region therein, and source and drain regions adjacent the channel region to generate shear and normal strain on the channel region. The semiconductor device may further comprise a gate over the channel region.

In some embodiments, the source and drain regions may have a diamond shape. In other embodiments, the source and drain regions may have a Y-shape. Additionally, the semiconductor device may further comprise a dielectric layer between the substrate and the at least one fin. The substrate and the at least one fin may each comprise silicon. The source and drain regions may each comprise silicon. The dielectric layer may comprise silicon dioxide.

Another aspect is directed to a method for making a semiconductor device. The method may comprise forming at least one fin above a substrate and having a channel region therein, and forming source and drain regions adjacent the channel region to generate shear and normal strain on the channel region.

Also generally, a semiconductor device may include a substrate, at least one fin above the substrate and having a channel region therein, source and drain regions adjacent the channel region, and a gate over the channel region. The at least one fin may be canted with respect to the source and drain regions to generate shear and normal strain on the channel region.

The at least one fin may be canted at an angle in a range of 22.5-67.5 degrees with respect to the source and drain regions. In other embodiments, the at least one fin may be canted at an angle in a range of 40-50 degrees with respect to the source and drain regions.

Additionally, the semiconductor device may further comprise a dielectric layer between the substrate and the at least one fin. The substrate and the at least one fin may each comprise silicon. For example, the source and drain regions may comprise silicon germanium. The dielectric layer may comprise silicon dioxide.

Another aspect is directed to a method making a semiconductor device. The method may comprise forming at least one fin above a substrate and having a channel region therein, forming source and drain regions adjacent the channel region, and forming a gate over the channel region, the at least one fin being canted with respect to the source and drain regions to generate shear and normal strain on the channel region.

BRIEF DESCRIPTION OF THE DRAWINGS

FIG. 2 is a diagram illustrating normal and shear stress, according to the present disclosure.

FIG. 3A is a schematic diagram of a top plan view of a semiconductor device, according to the present disclosure.

FIG. 3B is a schematic diagram of a top plan view of another embodiment of a semiconductor device, according to the present disclosure.

DETAILED DESCRIPTION

Figure 1:
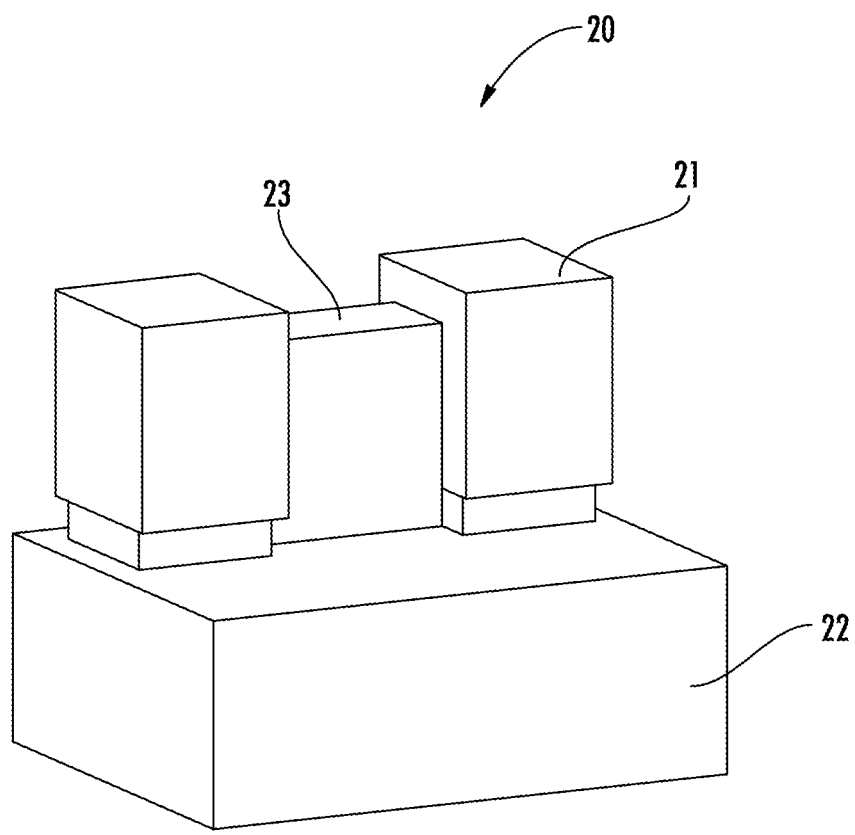
FIG. 1 is a schematic diagram of a perspective view of a semiconductor device, according to the prior art.

The present embodiments will now be described more fully hereinafter with reference to the accompanying drawings, in which preferred embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Referring briefly to FIG. 2, a diagram 25 illustrates normal and shear strain. Normal strain is defined by the following formula:

$$\varepsilon_x = \frac{\partial u_x}{\partial x}, \varepsilon_y = \frac{\partial u_y}{\partial x}, \varepsilon_z = \frac{\partial u_z}{\partial x}.$$

Shear strain is defined by the following formula:

$$\varepsilon_{xy} = \varepsilon_{yx} = \frac{\partial u_y}{\partial x} + \frac{\partial u_x}{\partial y},$$

$$\varepsilon_{yz} = \varepsilon_{zy} = \frac{\partial u_y}{\partial z} + \frac{\partial u_z}{\partial y},$$

$$\varepsilon_{xz} = \varepsilon_{zx} = \frac{\partial u_x}{\partial z} + \frac{\partial u_z}{\partial x}$$

$$\varepsilon_{xy} = \frac{1}{2}\left(\frac{\partial u_y}{\partial x} + \frac{\partial u_x}{\partial y}\right)$$

$$\varepsilon_{yz} = \frac{1}{2}\left(\frac{\partial u_y}{\partial z} + \frac{\partial u_z}{\partial y}\right).$$

$$\varepsilon_{xz} = \frac{1}{2}\left(\frac{\partial u_z}{\partial x} + \frac{\partial u_x}{\partial z}\right)$$

The transformation from strain tensor to stress tensor is finally obtained following the Hooke's law.

The impact on electrical performance (piezoresistance tensor) with stress is illustrated with silicon (001) surface wafer and [100] or [110] orientation. According to the crystal orientation, the effect of the shear stress on carrier mobility can be important, competitive with normal effect, depending on piezoresistance parameter (carrier type, crystal orientation and material). Table 1 provides a general valid case for any crystal orientation. (See Tables 1-3).

TABLE 1

Crystal Stress Component $$\left(\frac{\Delta\mu}{\mu}\right)_i = \begin{pmatrix} \pi_{11} & \pi_{12} & \pi_{13} & \pi_{14} & \pi_{15} & \pi_{16} \\ \pi_{12} & \pi_{22} & \pi_{23} & \pi_{24} & \pi_{25} & \pi_{26} \\ \pi_{13} & \pi_{12} & \pi_{33} & \pi_{34} & \pi_{35} & \pi_{36} \\ \pi_{14} & \pi_{24} & \pi_{34} & \pi_{44} & \pi_{45} & \pi_{46} \\ \pi_{15} & \pi_{25} & \pi_{35} & \pi_{45} & \pi_{55} & \pi_{56} \\ \pi_{16} & \pi_{26} & \pi_{36} & \pi_{46} & \pi_{56} & \pi_{66} \end{pmatrix} \begin{pmatrix} \sigma_{xx} \\ \sigma_{yy} \\ \sigma_{zz} \\ \gamma_{yz} \\ \gamma_{xz} \\ \gamma_{xy} \end{pmatrix}$$

TABLE 2

Crystal Stress Component
Crystal Orientation (001) [100]

$$\left(\frac{\Delta\mu}{\mu}\right)_i = \begin{pmatrix} \pi_{11} & \pi_{12} & \pi_{13} & 0 & 0 & 0 \\ \pi_{12} & \pi_{22} & \pi_{23} & 0 & 0 & 0 \\ \pi_{13} & \pi_{12} & \pi_{33} & 0 & 0 & 0 \\ 0 & 0 & 0 & \pi_{44} & 0 & 0 \\ 0 & 0 & 0 & 0 & \pi_{55} & 0 \\ 0 & 0 & 0 & 0 & 0 & \pi_{66} \end{pmatrix} \begin{pmatrix} \sigma_{xx} \\ \sigma_{yy} \\ \sigma_{zz} \\ \gamma_{yz} \\ \gamma_{xz} \\ \gamma_{xy} \end{pmatrix}$$

TABLE 3

Silicon Bulk Stress Values ($10^{-11}$ Pa$^{-1}$) [The pizo coefficient for the two traditional cases, including that given in Table 2.]

| $10^{-11}$ Pa | [100] N—Si | [100] P—Si | [110] N—Si | [110] P—Si |
| --- | --- | --- | --- | --- |
| $\pi_{11=}\pi_{22}$ | −102.1 | 6.6 | −31.6 | 71.8 |
| $\pi_{33}$ | −102.1 | 6.6 | −102.1 | 6.6 |
| $\pi_{12}$ | 53.4 | −1.1 | −17.6 | 66.3 |
| $\pi_{13=}\pi_{23}$ | 53.4 | −1.1 | 53.4 | −1.1 |
| $\pi_{44=}\pi_{55}$ | −13.6 | −1.1 | −13.6 | −1.1 |
| $\pi_{66}$ | −13.6 | −1.1 | −77.8 | 3.85 |
| other | 0 | 0 | 0 | 0 |

As visible on Tables 1-3, $\pi_{14}$, $\pi_{15}$ and $\pi_{16}$ of the first line of the piezo-resistance tensor impact the longitudinal conductivity in presence of shear stress. They are equal to 0 for the standard cases with the channel in [100] and [110] direction, meaning that there is no impact of the shear stress on the mobility. However, two ways are possible to take benefit from shear stress. First, for channel direction between [100] and [110] in (001) plane, i.e. theta between 0 and 45 deg, or for other less classical crystalline orientations, $\pi_{14}$, $\pi_{15}$ and $\pi_{16}$ might not be equal to zero. As a result, the shear component impacts the mobility. Second, as the magnitude of the shear stress increases, because of the strong impact of the shear stress on the band curvature responsible for mobility enhancement, some of the $\pi_{ij}$ terms can become non null, impacting the contribution of the shear stress on mobility. An indirect illustration is already demonstrated by the impact of the rotation by 45 deg from [100](001) to [110] (001). In that case, the longitudinal stress along [110] becomes a shear stress at the level of the band structure [100] oriented and impact the mobility. This is visible in Table 3 with enhanced values of $\pi_{11}$ in the [110] direction for p carrier $71.8 \times 10^{-11}$ Pa instead of $6.6 \times 10^{-11}$ Pa for the [100] direction.

Referring initially to FIGS. 3A and 4A-6A, a semiconductor device 30 according to the present disclosure is now described. The semiconductor device 30 illustratively includes a substrate 38, fins 36a-36b above the substrate and having a channel region 33 therein, and source and drain regions 31-32 adjacent the channel region to generate shear and normal strain on the channel region. In the illustrated embodiment, the semiconductor device 30 comprises a FINFET device, but the teachings herein may be applied to other semiconductor device types.

The source, drain, and channel regions 31-33 are formed from a biaxial stress layer of semiconductor material on the substrate 38. The substrate 38 may comprise a silicon bulk layer or a buried oxide substrate (i.e. a thin BOX). In other embodiments, the substrate 38 may comprise silicon on insulator (SOI) or silicon germanium on insulator (SGOI).

Advantageously, the generation of both normal and shear strain in the channel region 33 is in contrast to the prior art approach in FIG. 1, which generates only normal strain. In particular, the generation of shear strain improves carrier mobility in the channel region 33. In the present disclosure, the shear stress teachings may be effective especially for thin film channel transistors, such as fully depleted SOI (FD-SOI), ultra-thin body BOX (UTBB), and FINFETs. In FINFET embodiments, the design thereof has a greater degree of freedom in 3D structures to generate shear stress at the right place in the channel to enhance carrier mobility, thereby improving performance.

The semiconductor device 30 illustratively includes a gate 40 over the channel region. In the illustrated embodiment, the source and drain regions 31-32 have a diamond shape. Of course, in other embodiments, other shapes may be used so long as they create sufficient shear strain in the channel region 33.

Additionally, the semiconductor device 30 illustratively includes a dielectric layer 37 between the substrate 38 and the fins 36a-36b. The substrate 38 and the fins 36a-36b may each comprise silicon, for example. Also, the source and drain regions 31-32 may each comprise silicon. The dielectric layer 37 may comprise silicon dioxide, for example.

Another aspect is directed to a method for making a semiconductor device 30. The method may comprise forming at least one fin 36a-36b above a substrate 38 and having a channel region 33 therein, and forming source and drain regions 31-32 adjacent the channel region to generate shear and normal strain on the channel region.

Figure 4A:
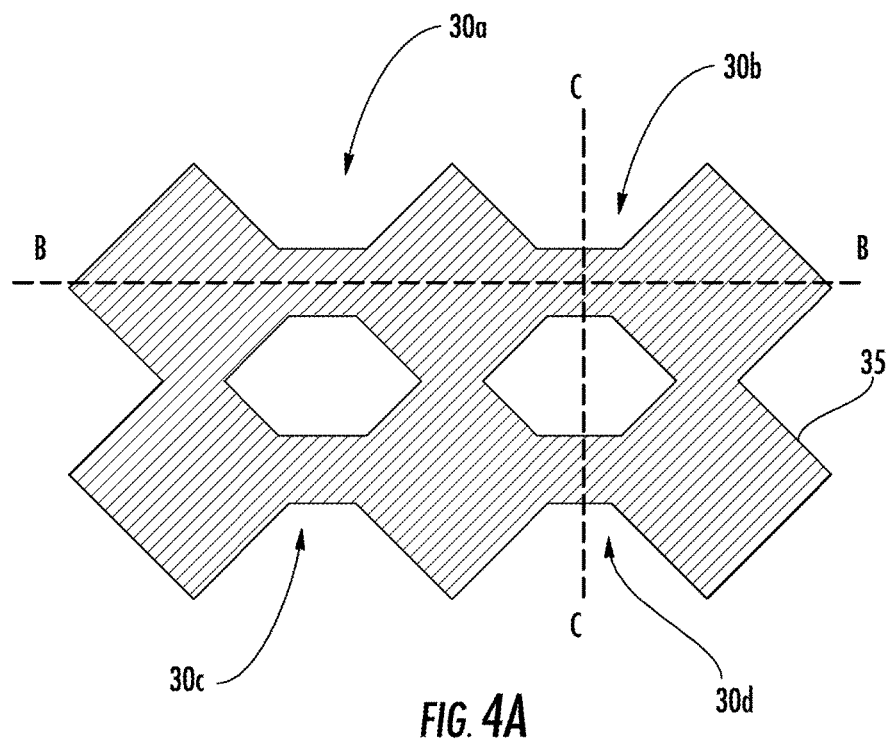
FIGS. 4A-4C are schematic diagrams of a top plan view, a cross-sectional view along line B-B, and a cross-sectional view along line C-C of a step in making a plurality of semiconductor devices of FIG. 3A, according to the present disclosure.
Figure 4B:
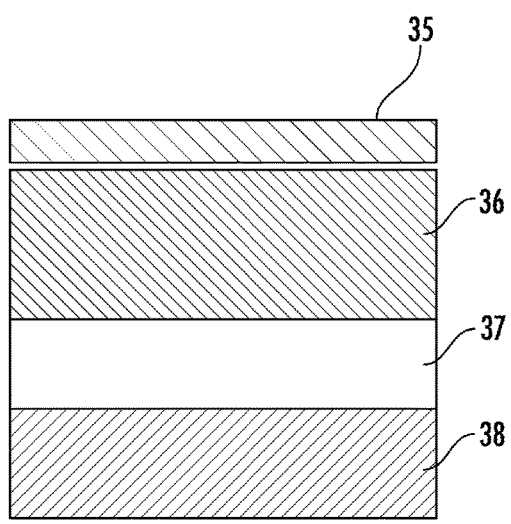
Figure 4C:
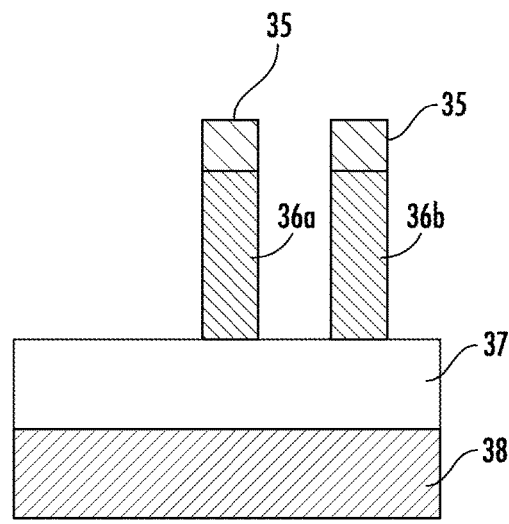
Figure 5A:
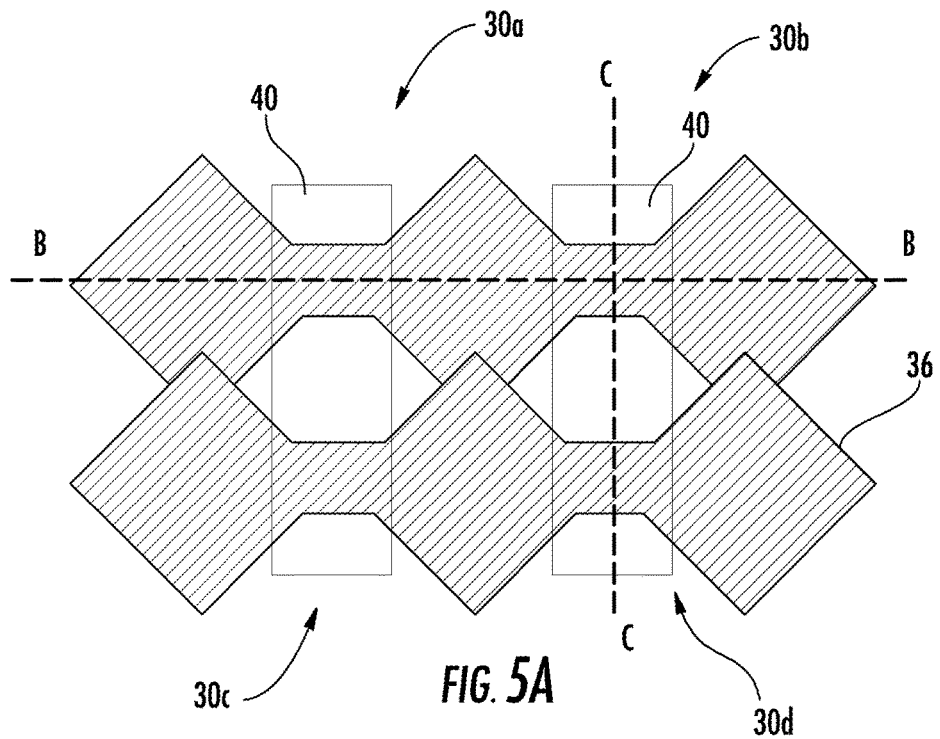
FIGS. 5A-5C are schematic diagrams of a top plan view, a cross-sectional view along line B-B, and a cross-sectional view along line C-C of a step in making a plurality of semiconductor devices of FIG. 3A, according to the present disclosure.
Figure 5B:
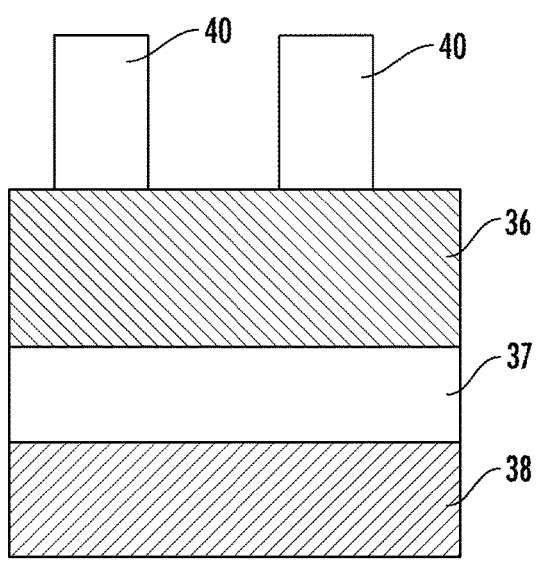
Figure 5C:
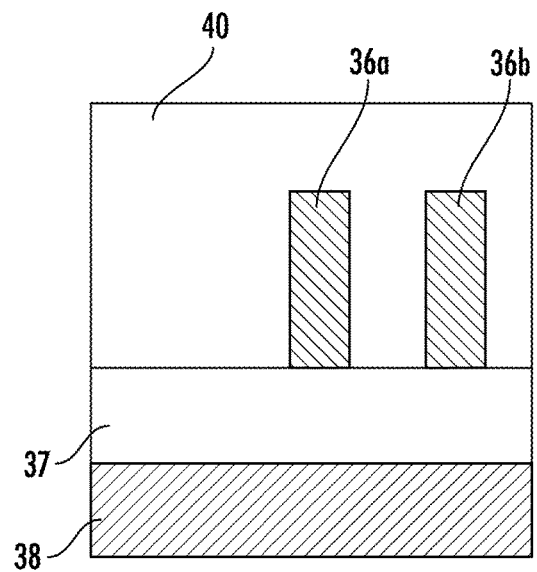

Referring now to FIGS. 4A-4C, the fins 36a-36b are formed on the dielectric layer 37, which is over the substrate 38. Subsequently, a mask layer 35 is formed over the fins 36a-36b. The mask layer 35 may comprise a silicon nitride layer, for example. Referring in particular to FIGS. 5A-5C, the gate 40 is formed on the fins 36a-36b. The gate 40 may comprise a plurality of layers comprising at least a dielectric layer, an electrically conductive layer forming a gate contact, and a resist layer.

Figure 6A:
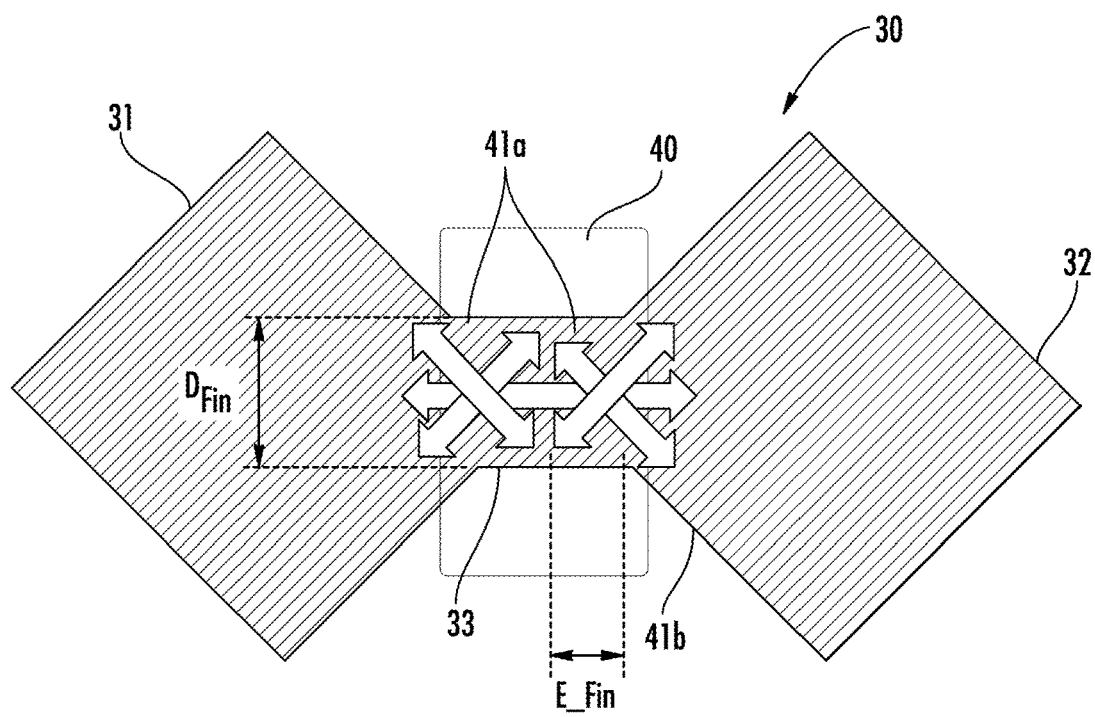
FIGS. 6A-6B are schematic diagrams of a top plan view of semiconductor devices of FIGS. 3A and 3B, respectively, with stress indicator arrows.

Referring now to FIG. 6A, an illustrative example of the semiconductor device 30 is shown with strain indicator arrows 41a-41b (shear strain 41a, normal strain 41b). The extension of the shear strain in the channel region 33 is defined by the following formula:

$$E_{Fin} = \frac{D_{Fin}}{\sqrt{2}};$$

where $E_{Fin}$=extension of the shear strain in the channel region, on both sides, which may be longer than the channel region; and $D_{fin}$ is Fin thickness. Here, the shear strain 41a is illustratively at 45 degrees, but other angles are possible.

Advantageously, the stress in the channel region 33 is obtained after shape forming for the source and drain regions 31-32. There is no need for complex epitaxial processes in the source and drain regions 31-32 to obtain the strain. Several integrations are possible, such as Fin First (formed before the dummy gate patterning) or after the gate patterning.

Figure 6B:
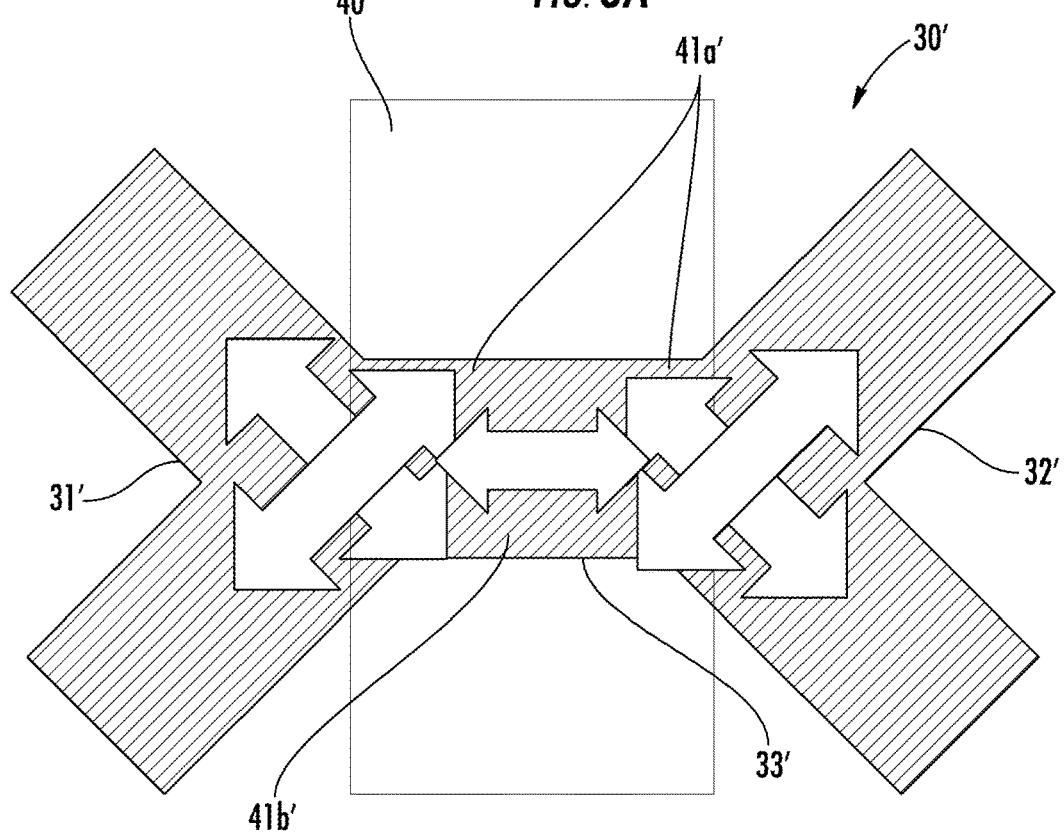

Referring now additionally to FIGS. 3B and 6B, another embodiment of the semiconductor device 30' is now described. In this embodiment of the semiconductor device 30', those elements already discussed above with respect to FIGS. 3A and 4A-6A are given prime notation and most require no further discussion herein. This embodiment differs from the previous embodiment in that this semiconductor device 30' has source and drain regions 31'-32' with a Y-shape (i.e. defining a "dog bone" shape). In particular, the source and drain regions 31'-32' each have a pair of arms extending in opposite directions, which create shear strain on the channel region 33'.

Figures 7A, 7B, 7C, 7D:
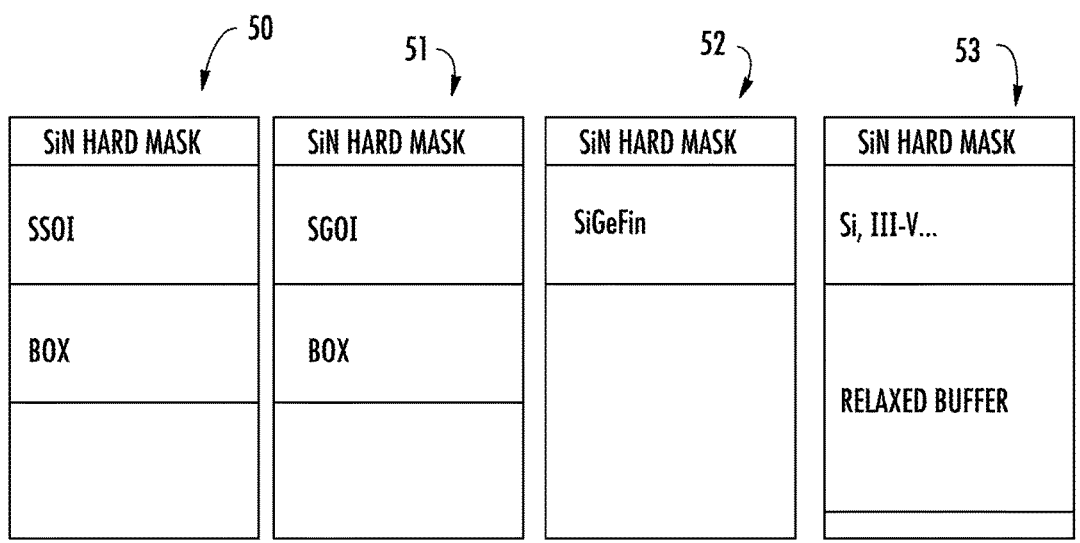
FIGS. 7A-7D are schematic diagrams of layer stacks for embodiments of a semiconductor device, according to the present disclosure.
Figure 8A:
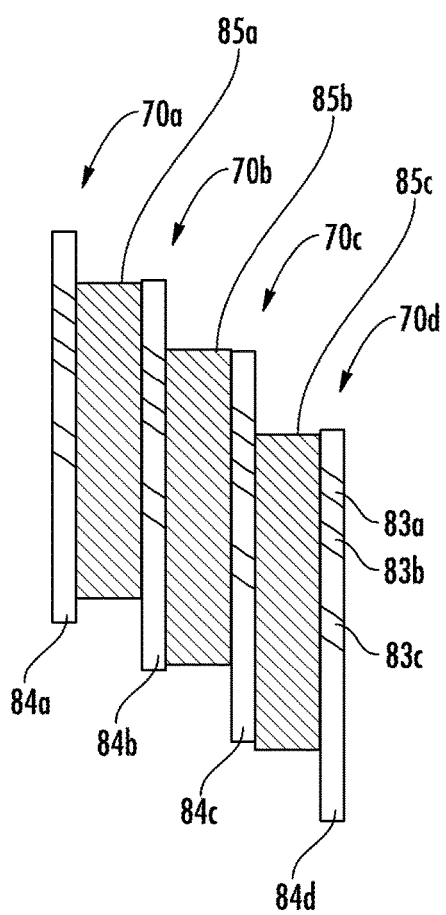
FIGS. 8A and 8B are schematic diagrams of a top plan view and an enlarged top plan view of another embodiment of a semiconductor device, according to the present disclosure.
Figure 8B:
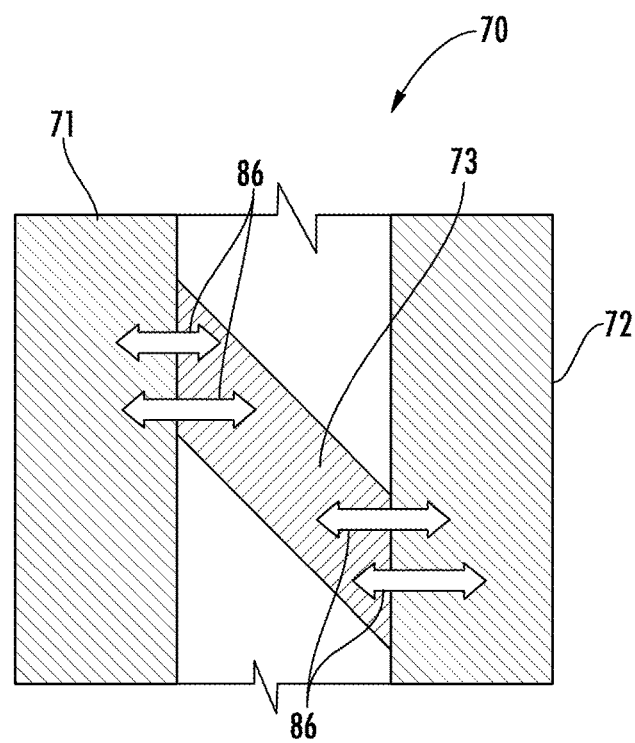

Referring now to FIGS. 7A-7C, several examples of heavy metal deposition layer stacks are shown. The diagrams 50-53 illustrate several embodiments for forming the semiconductor device 30. These diagrams 50-53 illustrate the possibility of using different stressed channel materials (to replace region 30) with strained SOI, strained SGOI as well with SiGe layer, III-V or any material epitaxially grown on silicon substrate to form the channel.

Referring now to FIGS. 8A-12C, another semiconductor device 70a-70d according to the present disclosure is now described. The semiconductor device 70a-70d illustratively includes a substrate 81, a plurality of fins 83a-83c above the substrate and having a channel region 73 therein, source and drain regions 71-72 adjacent the channel region, and a gate 84a-84d over the channel region. Each of the plurality of fins 83a-83c may be canted with respect to the source and drain regions 71-72 to generate shear and normal strain on the channel region 73. In FIG. 8B, the semiconductor device 30 is shown with shear strain indicator arrows 86. In the illustrated embodiment, the semiconductor device 70a-70d comprises a FINFET device, but the teachings herein may be applied to other semiconductor device types.

In the illustrated embodiment, each of the fins 83a-83c is canted at an angle of 45 degrees with respect to the source and drain regions 71-72. In other embodiments, each of the fins 83a-83c may be canted at an angle less than 45 degrees with respect to the source and drain regions 71-72, or in the range of 22.5-67.5 degrees or for improved performance, in the range of 40-50 degrees.

Additionally, the semiconductor device 70a-70d illustratively includes a dielectric layer 82 between the substrate 81 and the plurality of fins 83a-83c. The substrate 81 and the plurality of fins 83a-83c may each comprise silicon, for example. For example, the source and drain regions 71-72 may comprise silicon germanium. Also, the dielectric layer 82 may comprise silicon dioxide.

Another aspect is directed to a method making a semiconductor device 70a-70d. The method may comprise forming at least one fin 83a-83c above a substrate 81 and having a channel region 73 therein, forming source and drain regions 71-72 adjacent the channel region, and forming a gate 84a-84d over the channel region, the at least one fin being canted with respect to the source and drain regions to generate shear and normal strain on the channel region.

Figure 9A:
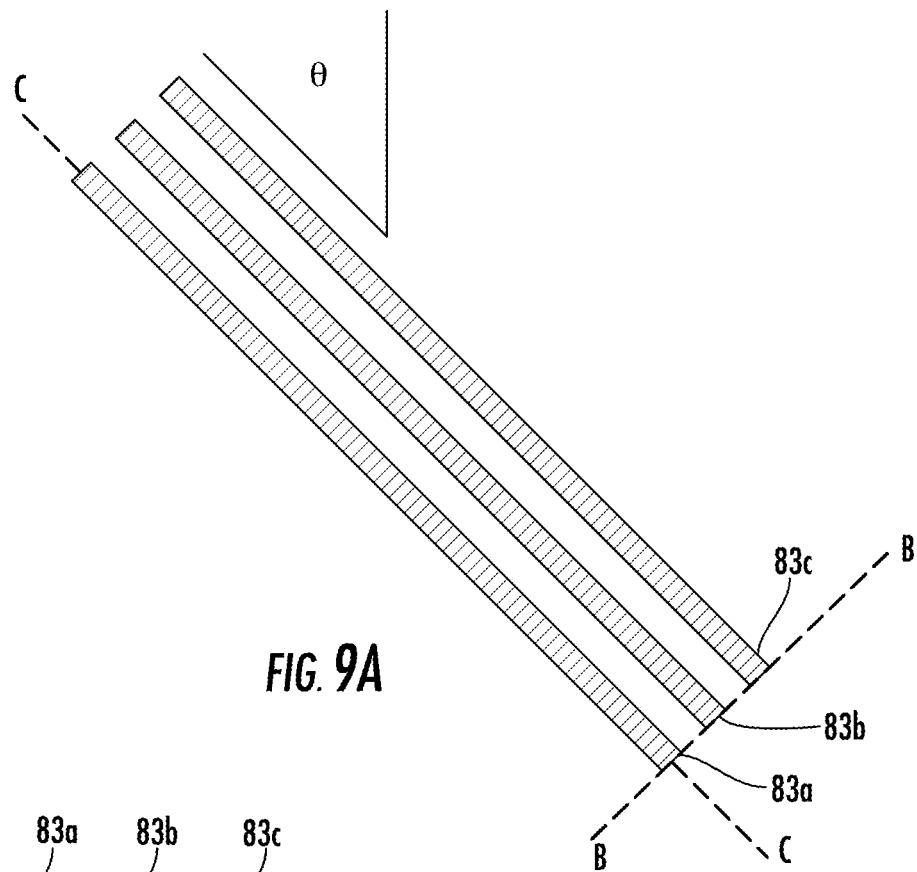
FIGS. 9A-9C are schematic diagrams of a top plan view, a cross-sectional view along line B-B, and a cross-sectional view along line C-C of a step in making a plurality of semiconductor devices of FIGS. 8A-8B, according to the present disclosure.
Figure 9B:
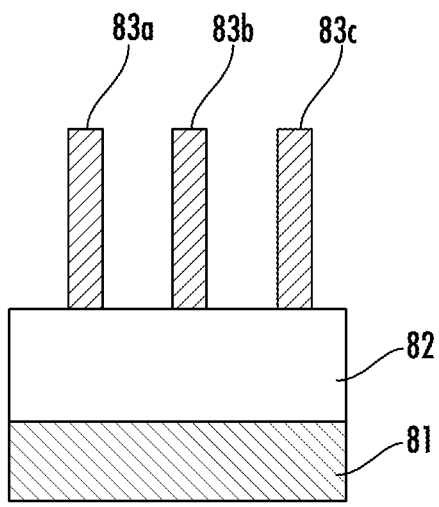
Figure 9C:
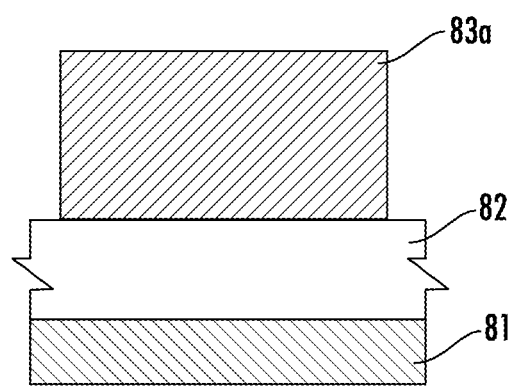
Figure 10A:
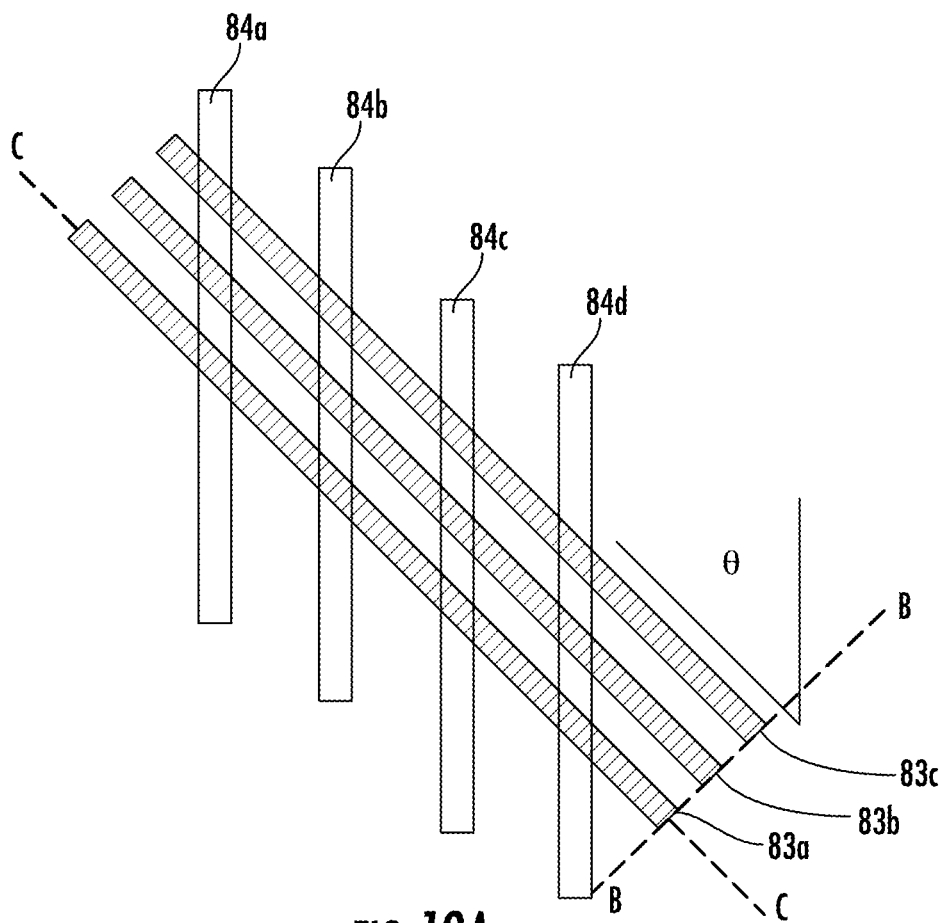
FIGS. 10A-10C are schematic diagrams of a top plan view, a cross-sectional view along line B-B, and a cross-sectional view along line C-C of a step in making a plurality of semiconductor devices of FIGS. 8A-8B, according to the present disclosure.
Figure 10B:
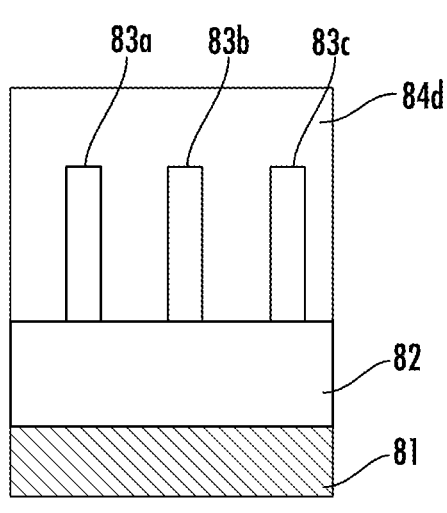
Figure 10C:
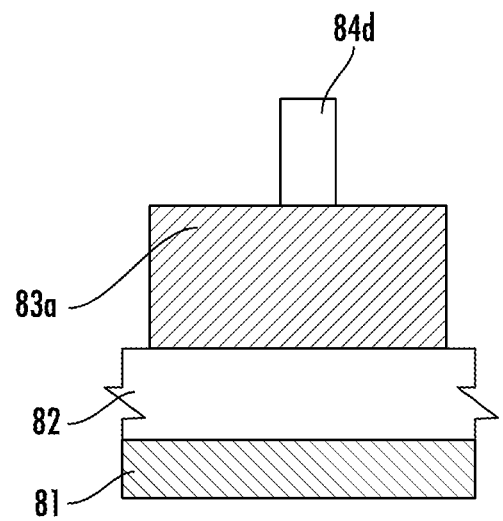
Figure 11A:
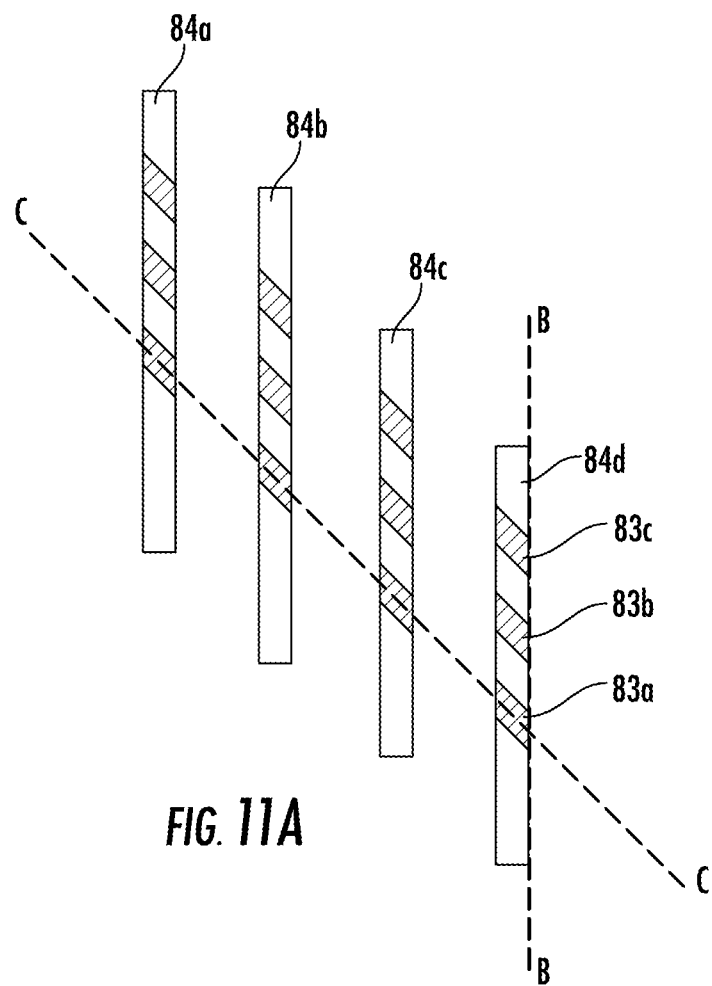
FIGS. 11A-11C are schematic diagrams of a top plan view, a cross-sectional view along line B-B, and a cross-sectional view along line C-C of a step in making a plurality of semiconductor devices of FIGS. 8A-8B, according to the present disclosure.
Figure 11B:
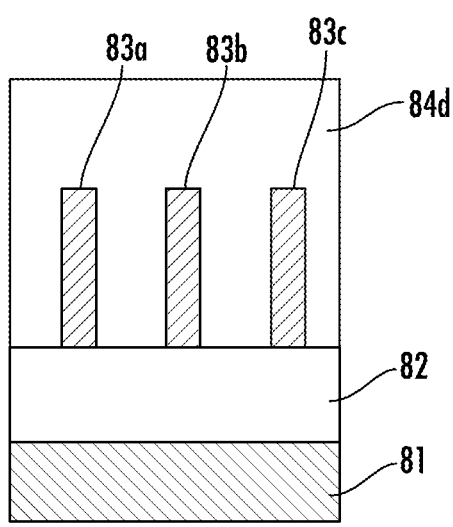
Figure 11C:
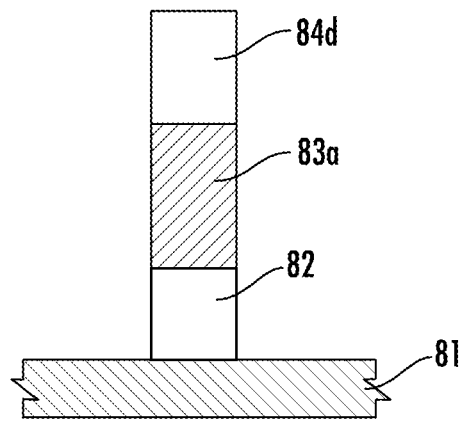
Figure 12A:
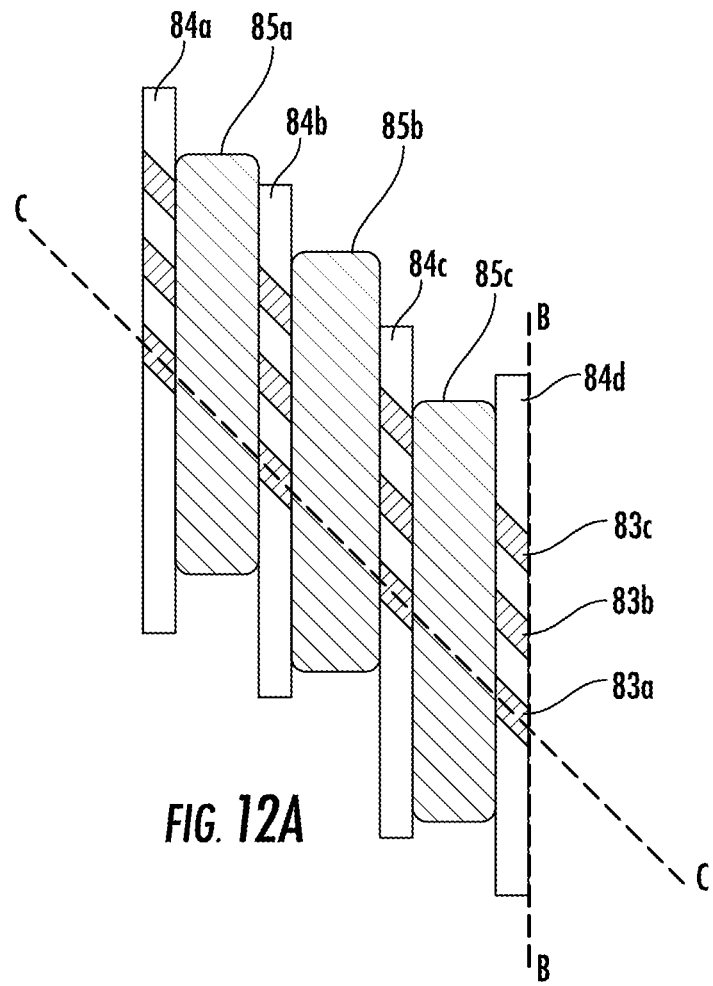
FIGS. 12A-12C are schematic diagrams of a top plan view, a cross-sectional view along line B-B, and a cross-sectional view along line C-C of a step in making a plurality of semiconductor devices of FIGS. 8A-8B, according to the present disclosure.
Figure 12B:
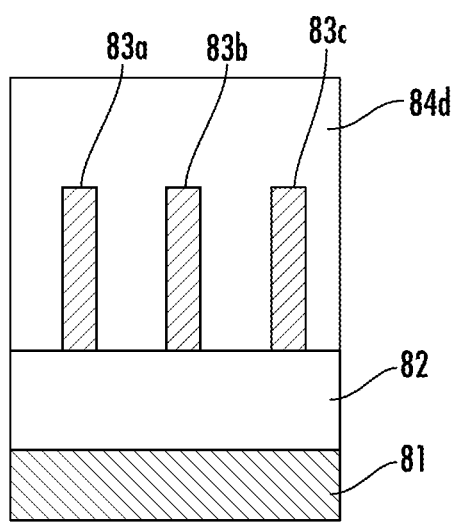
Figure 12C:
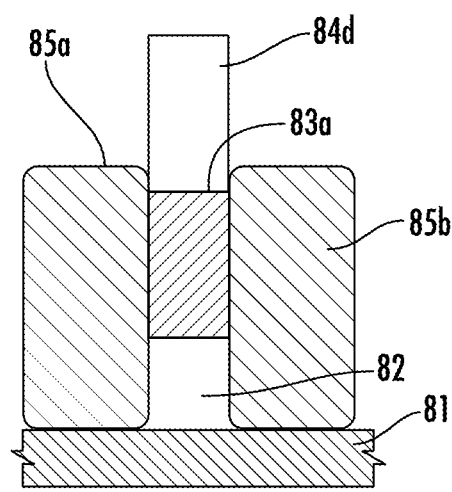

Referring in particular to FIGS. 9A-9C, the method illustratively includes forming the plurality of fins 83a-83c on the dielectric layer 82, which is above the substrate 81. In FIGS. 10A-10C, the gate 84a-84d is formed on the fins 83a-83c and the dielectric layer 82. In FIGS. 11A-11C, the recesses for the source and drain regions 71-72 are formed during an etching step. In FIGS. 12A-12C, the source and drain regions 71-72 are formed from an epitaxial layer 85a-85c. The epitaxial layer 85a-85c may comprise silicon germanium, for example.

Advantageously, the method for making the semiconductor device 70a-70d is a self-aligned process, i.e. no additional mask layers are necessary. Moreover, the semiconductor device 70a-70d may also work if the fins 83a-83c are already intrinsically strained (e.g. SGOI, silicon germanium fin, SSOI etc.). In that case, the shear is added to the standard longitudinal stress in the fin coming from the intrinsic strain and brings more efficiency. Also, this method of making a semiconductor device 70a-70d could help to increase the surface for source-drain stressor for a given gate pitch.

A fin field-effect transistor (FINFET) semiconductor device comprising: a substrate; a plurality of fins above said substrate, each fin having a channel region therein; and a plurality a source and drain regions respectively adjacent the channel regions to generate shear and normal strain on the channel regions. The FINFET semiconductor device further comprising a plurality of gates respectively over the channel regions. The plurality of source and drain regions have a diamond shape. The plurality of source and drain regions have a Y-shape.

A method for making a semiconductor device comprising: forming at least one fin above a substrate and having a channel region therein; forming source and drain regions adjacent the channel region to generate shear and normal strain on the channel region; and forming a gate over the channel region. The method includes forming source and drain regions have a diamond shape. The method includes forming source and drain regions have a Y-shape. The method includes forming a dielectric layer between the substrate and the at least one fin. The dielectric layer comprises silicon dioxide. The substrate and the at least one fin each comprises silicon.

The source and drain regions each comprises silicon. A fin field-effect transistor (FINFET) semiconductor device comprising: a substrate; a plurality of fins above said substrate, each fin having a channel region therein; a plurality of source and drain regions respectively adjacent the channel regions; and a plurality of gates respectively over the channel regions; said plurality of fins being canted with respect to said plurality of source and drain regions to generate shear and normal strain on the channel regions. The plurality of fins is canted at an angle in a range of 22.5-67.5 degrees with respect to said plurality of source and drain regions. The plurality of fins is canted at an angle in a range of 40-50 degrees with respect to said plurality of source and drain regions. The FINFET semiconductor device includes a dielectric layer between said substrate and said plurality of fins. The dielectric layer comprises silicon dioxide. The substrate and said plurality of fins each comprises silicon. The plurality of source and drain regions comprise silicon germanium.

The method may further include forming a dielectric layer between the substrate and the at least one fin, the substrate and the at least one fin each comprises silicon, and the source and drain regions comprise silicon germanium.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A device comprising:
   a substrate;
   a channel region on the substrate, the channel region extending in a first direction;
   a source region adjacent to a first side of the channel region, the source region being diamond shaped in a plan view; and
   a drain region adjacent to a second side of the channel region opposite the first side of the channel region, the drain region being diamond shaped in a plan view.

2. The device of claim 1, further comprising a gate structure over the channel region.

3. The device of claim 1 wherein the source region has an axis extending between a first vertex and a second vertex, the axis extending in the first direction.

4. The device of claim 3 wherein the drain region has an axis extending between a first vertex and a second vertex, the axis extending in the first direction.

5. The device of claim 1 wherein the channel has a first dimension in a second direction and the diamond shaped source region has a widest dimension in the second direction that is greater than the first dimension of the channel.

6. A device, comprising:
   a first channel extending along a first axis;
   a gate structure overlapping the first channel, the gate structure having a length that extends along a second axis, the second axis being at an oblique angle to the first axis; and
   a source region and a drain region adjacent to the first channel, the source and drain regions being aligned along the second axis.

7. The device of claim 6, further comprising a substrate and a fin on the substrate, the first channel being in the fin.

8. The device of claim 6, further comprising a second channel spaced from the first channel, the second channel extending along the first axis.

9. The device of claim 8 wherein the gate structure overlaps the second channel.

10. A method, comprising:
    forming a first channel structure on a substrate, the first channel structure extending along a first axis;
    forming a gate structure on the substrate and overlapping the first channel structure, the gate structure having a length that extends along a second axis, the second axis being at an oblique angle to the first axis; and
    forming a source region and a drain region adjacent to the first channel structure, the source and drain regions being aligned along the second axis.

11. The method of claim 10, further comprising forming a fin on the substrate and forming the first channel structure in the fin.

12. The method of claim 10, further comprising forming a second channel spaced from the first channel, the second channel extending along the first axis.

13. The method of claim 12 further comprising forming the gate structure overlapping the second channel.

14. The method of claim 10, further comprising forming a diamond shaped source region and a diamond shaped drain region adjacent to the first channel structure, the source and drain regions being aligned along the second axis.

15. The method of claim 10, further comprising forming a Y-shaped source region and a Y-shaped drain region adjacent to the first channel structure, the source and drain regions being aligned along the second axis.

\* \* \* \* \*

UNITED STATES PATENT AND TRADEMARK OFFICE
CERTIFICATE OF CORRECTION

PATENT NO. : 10,505,043 B2
APPLICATION NO. : 16/212632
DATED : December 10, 2019
INVENTOR(S) : Pierre Morin et al.

It is certified that error appears in the above-identified patent and that said Letters Patent is hereby corrected as shown below:

On the Title Page

Item (56) References Cited:
"8,310,013    B2    11/2012 Lin"
Should read:
--8,310,013    B2    11/2012 Lin et al--.

Signed and Sealed this
Twenty-eighth Day of April, 2020

Andrei Iancu
*Director of the United States Patent and Trademark Office*